United States Patent
Querbach et al.

(10) Patent No.: US 10,216,657 B2
(45) Date of Patent: *Feb. 26, 2019

(54) EXTENDED PLATFORM WITH ADDITIONAL MEMORY MODULE SLOTS PER CPU SOCKET AND CONFIGURED FOR INCREASED PERFORMANCE

(71) Applicant: INTEL CORPORATION, Santa Clara, CA (US)

(72) Inventors: Bruce Querbach, Hillsboro, OR (US); Pete D. Vogt, Boulder, CO (US)

(73) Assignee: INTEL CORPORATION, Santa Clara, CA (US)

( * ) Notice: Subject to any disclaimer, the term of this patent is extended or adjusted under 35 U.S.C. 154(b) by 182 days.

This patent is subject to a terminal disclaimer.

(21) Appl. No.: 15/283,186

(22) Filed: Sep. 30, 2016

(65) Prior Publication Data

US 2018/0095909 A1    Apr. 5, 2018

(51) Int. Cl.
| | | |
|---|---|---|
| *G06F 1/00* | (2006.01) | |
| *G06F 13/16* | (2006.01) | |
| *G06F 1/18* | (2006.01) | |
| *G11C 5/06* | (2006.01) | |

(52) U.S. Cl.
CPC ............ *G06F 13/1678* (2013.01); *G06F 1/18* (2013.01); *G06F 13/1694* (2013.01); *G11C 5/06* (2013.01)

(58) Field of Classification Search
CPC ..................... G06F 1/18; G11C 5/06
See application file for complete search history.

(56) References Cited

U.S. PATENT DOCUMENTS

| | | |
|---|---|---|
| 4,656,605 A | 4/1987 | Clayton |
| 5,513,135 A | 4/1996 | Dell et al. |
| 6,717,823 B2 | 4/2004 | McCall et al. |
| 6,793,408 B2 | 9/2004 | Levy et al. |

(Continued)

OTHER PUBLICATIONS

Intel Corporation, "Density Optimized System with Rich Memory and I/O Features", Product Brief, © 2016, 5 pages.

(Continued)

*Primary Examiner* — Zachary K Huson
(74) *Attorney, Agent, or Firm* — Konrad Raynes Davda & Victor LLP; Alan S. Raynes (57) ABSTRACT

Electronic devices and methods including a printed circuit board configured to accept CPUs and memory modules are described. One apparatus includes a printed circuit board (PCB) that includes a printed circuit board defining a length and a width, the length being greater than the width. The apparatus includes a first row of elements on the PCB, including a first memory region configured to receive at least one memory module. The apparatus includes a second row of elements on the PCB, including a first central processing unit (CPU) socket configured to receive a first CPU, and a second CPU socket configured to receive a second CPU, the first CPU socket and the second CPU socket positioned side by side along the width of the PCB. The apparatus also includes a third row of elements on the PCB, including a second memory region configured to receive a at least one memory module, wherein the second row of elements is positioned between the first row of elements and the third rows of elements. Other embodiments are described and claimed.

25 Claims, 8 Drawing Sheets

(56) References Cited

U.S. PATENT DOCUMENTS

| | | | |
|---|---|---|---|
| 7,024,518 | B2 | 4/2006 | Halbert et al. |
| 7,127,629 | B2 | 10/2006 | Vogt |
| 7,130,229 | B2 | 10/2006 | Dahlen et al. |
| 7,143,207 | B2 | 11/2006 | Vogt |
| 7,165,153 | B2 | 1/2007 | Vogt |
| 7,194,581 | B2 | 3/2007 | Vogt |
| 7,200,787 | B2 | 4/2007 | Vogt et al. |
| 7,212,423 | B2 | 5/2007 | Vogt |
| 7,219,294 | B2 | 5/2007 | Vogt |
| 7,243,205 | B2 | 7/2007 | Freeman et al. |
| 7,268,020 | B2 | 9/2007 | Vogt |
| 7,340,537 | B2 | 3/2008 | Vogt |
| 7,343,458 | B2 | 3/2008 | Vogt |
| 7,366,931 | B2 | 4/2008 | Vogt |
| 7,369,634 | B2 | 5/2008 | Panikkar et al. |
| 7,383,399 | B2 | 6/2008 | Vogt |
| 7,386,768 | B2 | 6/2008 | Vogt et al. |
| 7,395,485 | B2 | 7/2008 | Vogt |
| 7,417,883 | B2 | 8/2008 | Vogt |
| 7,447,953 | B2 | 11/2008 | Vogt |
| 7,464,241 | B2 | 12/2008 | Vogt |
| 7,516,349 | B2 | 4/2009 | Alexander et al. |
| 7,539,909 | B2 | 5/2009 | LeClerg et al. |
| 7,542,322 | B2 | 6/2009 | McCall et al. |
| 7,650,558 | B2 | 1/2010 | Rosenbluth et al. |
| 7,702,874 | B2 | 4/2010 | Vogt |
| 7,827,462 | B2 | 11/2010 | Vogt |
| 7,890,811 | B2 | 2/2011 | Rothman et al. |
| 8,020,056 | B2 | 9/2011 | Vogt et al. |
| 8,086,812 | B2 | 12/2011 | Donnelly et al. |
| 8,098,783 | B2 | 1/2012 | Panikkar et al. |
| 8,099,687 | B2 | 1/2012 | Leddige et al. |
| 8,171,331 | B2 | 5/2012 | Vogt |
| 8,612,809 | B2 | 12/2013 | Casper et al. |
| 8,914,568 | B2 | 12/2014 | Chinnaswamy et al. |
| 9,261,925 | B1 | 2/2016 | Palis et al. |
| 9,818,457 | B1* | 11/2017 | Querbach ............ H05K 1/141 |
| 2003/0011391 | A1 | 1/2003 | Brunelle et al. |
| 2004/0083196 | A1 | 4/2004 | Reasor et al. |
| 2005/0268061 | A1 | 12/2005 | Vogt |
| 2006/0004953 | A1 | 1/2006 | Vogt |
| 2006/0198114 | A1 | 9/2006 | Coutancier et al. |
| 2006/0288132 | A1 | 12/2006 | McCall et al. |
| 2008/0055868 | A1* | 3/2008 | Peterson ............ H05K 7/20727 361/752 |
| 2010/0036997 | A1 | 2/2010 | Brewer et al. |
| 2011/0149501 | A1 | 6/2011 | Hughes et al. |
| 2012/0001763 | A1 | 1/2012 | Billick et al. |
| 2012/0110363 | A1 | 5/2012 | Bacchus et al. |
| 2013/0138844 | A1* | 5/2013 | Karamcheti ............ G06F 13/12 710/74 |
| 2014/0117552 | A1 | 5/2014 | Qian et al. |
| 2014/0310490 | A1 | 10/2014 | Vogt |
| 2015/0199266 | A1 | 7/2015 | Franchetti et al. |
| 2016/0378151 | A1 | 12/2016 | Querbach et al. |

OTHER PUBLICATIONS

Intel Corporation, "Intel Server Board S2600TP Product Family Configuration Guide and Spares/Accessories List", Revision 2.1, Jan. 2016, 37 pp.

Intel Corporation, "Intel Server Board S2600TP Product Family and Intel Compute Module HNS2600TP Product Family", Technical Product Specification, Revision 1.41, Apr. 2016, 205 pp.

U.S. Appl. No. 15/283,167, entitled "Extended Platform With Additional Memory Module Slots Per CPU Socket", filed Sep. 30, 2016, 26 pp. [77.360 (Appln)].

Notice of Allowance for U.S. Appl. No. 15/283,167, dated Mar. 15, 2017, 9 pp. [77.360 (NOA1)].

International Search Report and Written Opinion for International Application No. PCT/US2017/054190, dated Jan. 15, 2018, 15 pp. [77.363PCT (ISR & WO)].

International Search Report and Written Opinion for International Application No. PCT/US2017/054186, dated Jan. 11, 2018, 10 pp. [77.360PCT (ISR & WO)].

U.S. Appl. No. 15/808,390, filed Nov. 9, 2017.

* cited by examiner

EXTENDED PLATFORM WITH ADDITIONAL MEMORY MODULE SLOTS PER CPU SOCKET AND CONFIGURED FOR INCREASED PERFORMANCE

TECHNICAL FIELD

Embodiments related generally to computer platform configurations in electronic devices, including printed circuit boards and elements positioned thereon.

BACKGROUND

Optimization of memory bandwidth is becoming increasingly important in the development of advanced computer platforms. One type of computer platform includes a stacked board configuration with stacked motherboards in a server platform, including an upper board and a lower board. The motherboards may each include two central processing units (CPUs), each positioned in a CPU socket, with the CPUs positioned between groups of multiple memory module slots (also known as sockets) for housing memory such as dual-inline memory modules (DIMMs). Each group of multiple memory module slots may include up to four DIMMs, so that each CPU may be coupled to up to eight DIMMs. Other features on the motherboard may include conventional features such as fans and input/output connections. The computer platform also includes groups of hard drives positioned in a hard drive bay adjacent to an end of the stacked motherboards.

There is a need in the art for increasing the memory bandwidth to improve computer performance.

BRIEF DESCRIPTION OF THE DRAWINGS

Embodiments are described by way of example, with reference to the accompanying drawings, in which like reference numerals may refer to similar elements.

DESCRIPTION OF EMBODIMENTS

The stacked motherboard computer platform configuration discussed in the background above includes a hard drive bay adjacent to an end of the boards. The hard drives positioned in the bay may be sized to be about the same height as that of the two stacked boards (with the CPUs and DIMMs positioned thereon). Certain embodiments utilize a printed circuit board (PCB) such as a motherboard that may extend into what would have been the drive bay in an earlier conventional system. By extending the motherboard, additional memory module slots such as DIMM slots may be positioned on the motherboard and used to provide additional memory bandwidth.

References in the specification to "embodiments," "certain embodiments," "an embodiment," etc., indicate that the embodiment described may include a particular feature, structure, or characteristic, but every embodiment may not necessarily include the particular feature, structure, or characteristic. Moreover, such phrases are not necessarily referring to the same embodiment. Certain embodiments relate to platform configurations. Embodiments include both devices and methods.

Certain embodiments relate to computer platforms including a printed circuit board that is configured to include a greater number of memory module slots for accepting memory components such as, for example, DIMMs. The use of greater numbers of DIMMs can lead to greater memory bandwidth and increased performance. Certain embodiments include the use of a board that extends into the position in a computer platform that in conventional systems defines the hard drive bay. Such boards then include a plurality of additional memory module slots for accepting memory components such as, for example, DIMMs. The additional memory slots enable each CPU on the board to utilize more DIMMs and improve memory bandwidth and performance.

Certain embodiments include the use of a PCB such as a motherboard including three rows of elements including a first row of elements including a group of memory module slots. The motherboard also includes a second row of elements comprising a plurality of CPU sockets (for example, a first CPU and a second CPUs positioned side by side). The motherboard also includes a third row of elements including a group of memory module slots. The first row and the third row of elements may include no CPUs and may include some memory module slots that are configured to interact with the first CPU socket and other memory module slots that are configured to interact with the second CPU socket. CPUs may be inserted into the CPU sockets and memory modules such as DIMMs may be inserted into the memory module slots.

Certain embodiments may utilize memory modules including a variety of DIMMs. In certain embodiments, high speed input/output (HSIO) links (i.e., interconnect, bus, etc.) are used to transmit data from the memory modules to the CPUs.

Certain embodiments relate to apparatus configurations, and certain embodiments relate to process operations.

Reference below will be made to the drawings wherein like structures may be provided with like reference designations. In order to show the structures of various embodiments most clearly, the drawings included herein include diagrammatic representations of certain structures. Thus, the actual appearance of the fabricated structures may appear different while still incorporating the claimed structures of the illustrated embodiments. Moreover, the drawings may show only the structures necessary to understand the illustrated embodiments. Additional structures known in the art may not have not been included to maintain the clarity of the drawings.

Figure 1:
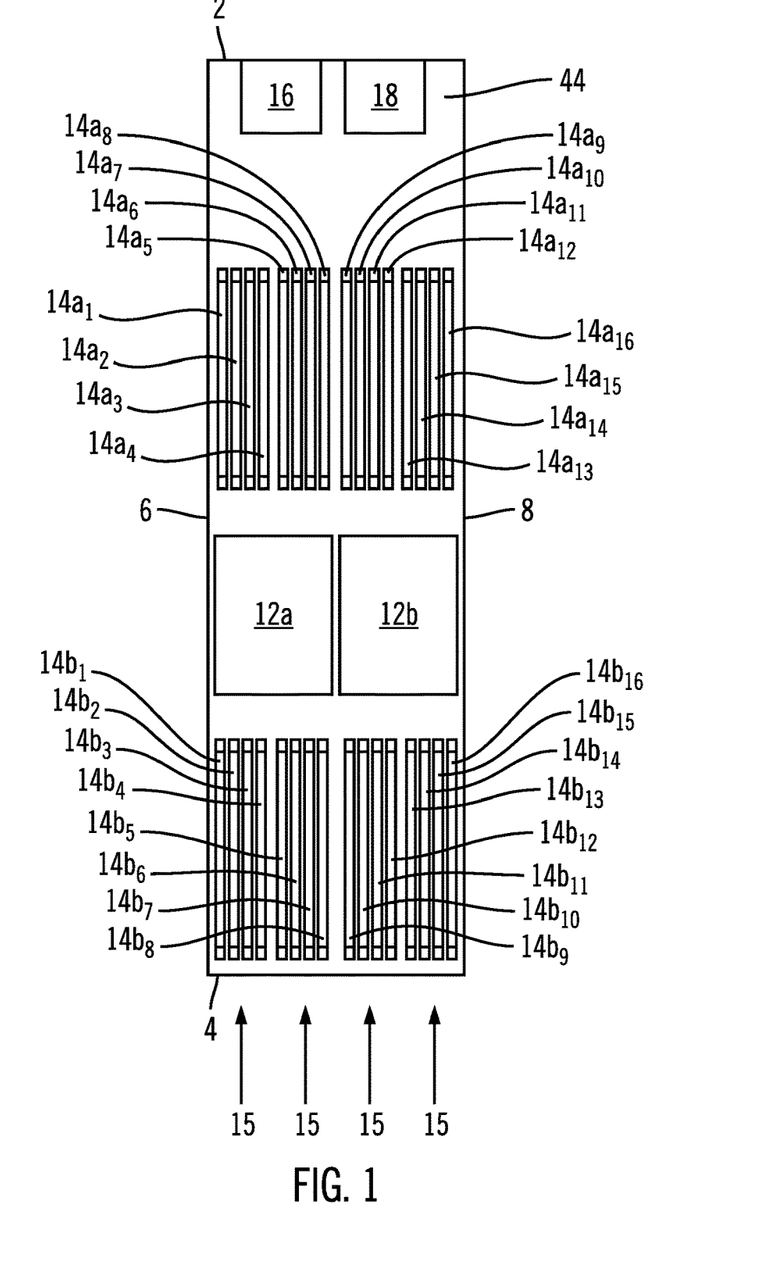
FIG. 1 illustrates a computer platform configuration including a printed circuit board, in accordance with certain embodiments.

FIG. 1 illustrates an embodiment of a printed circuit board (PCB) 10 for use in a computer assembly. The PCB 10 defines a length between an end 2 and an end 4, and defines a width between a side 6 and a side 8. The PCB 10 in FIG. 1 has a length that is greater than the width. The PCB 10 includes first and second central processing unit (CPU) sockets 12a, 12b that are configured to accept a CPU therein. The PCB 10 also includes a plurality of memory module slots $14a_1$-$14a_{16}$ and $14b_1$-$14b_{16}$. In certain embodiments each of the CPU sockets 12a, 12b may interact with sixteen memory module slots. The PCB 10 configuration illustrated in FIG. 1 includes comprises a first row of elements in a first area of the PCB 10 between the side 6 and the side 8, including memory module slots $14a_1$-$14a_{16}$. A second row of elements in a second area of the PCB 10 includes CPU sockets 12a, 12b positioned side by side along the width of the PCB between the side 6 and the side 8. A third row of elements in a third area of the PCB 10 includes memory module slots $14c_1$-$14c_{16}$, positioned between the side 6 and the side 8. The second row of elements is positioned between the first row of elements and the third row of elements.

CPU socket 12a may be electrically coupled to the eight memory module slots such as memory module slots (such as $14a_1$-$14a_8$) positioned in the first row of elements and eight of the memory module slots from the third row of elements (for example, memory module slots $14b_1$-$14b_8$). CPU socket 12b may be similarly electrically coupled to the eight memory module slots $14b_1$-$14b_8$ positioned in the first row of elements and eight of the memory module slots from the third row of elements (for example, memory module slots $14b_9$-$14b+_{16}$).

The PCB 10 may also include locations 16, 18 near the end 2 of the PCB 20 where other features such as external input/output connections may be made. Such input/output connections may include any connections, including, but not limited to,
Ethernet connections, USB connections, and video connections. Other types of features, including, but not limited to, board management hardware and routing, may also be present on the PCB 10.

Figure 2:
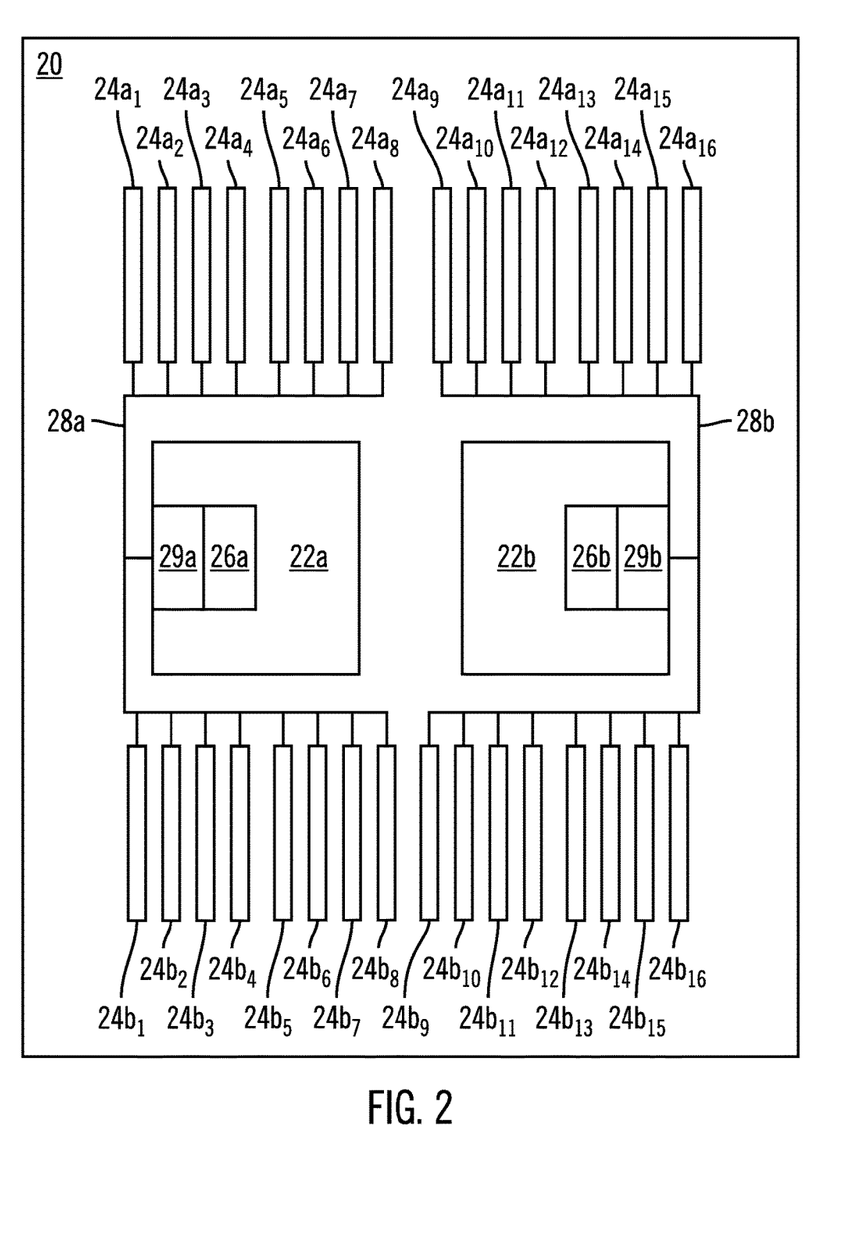
FIG. 2 illustrates CPU and memory module architecture in accordance with certain embodiments.

FIG. 2 illustrates a block diagram illustrating the interaction of first and second CPU's and memory modules (for example, DIMMs) on a PCB 20 similar to the PCB 10 in FIG. 1, in accordance with certain embodiments. As seen in the embodiment illustrated in FIG. 2, the PCB may include three rows of elements, with the first row including a plurality of DIMMs $24a_1$-$24a_{16}$, a second row of elements including a first CPU 22a and a second CPU 22b, and a third row of elements including a plurality of DIMMs $24b_1$-$24b_{16}$.

DIMMs $24a_1$-$24a_8$ and $24b_1$-$24b_8$ are coupled to a memory controller 26a through a link 28a, and DIMMs $24a_9$-$24a_{16}$ and $24b_9$-$24b_{16}$ are coupled to a memory controller 26b through a link 28b. The links 28a, 28b may include one or more channels through which data can be delivered. In certain embodiments the memory controllers 26a, 26b may be integral to the CPUs 22a, 22b. The links 28a, 28b may in certain embodiments send data from a DIMM to another DIMM prior to the data reaching the memory controllers 26a, 26b. A daisy chain configuration may be used in certain embodiments. Certain embodiments may also utilize the links 28a, 28b in a manner so that data from a DIMM does not pass through any other DIMMs as it is transmitted to the memory controllers 26a, 26b. It should be appreciated that the electrical connection between the DIMMs and the CPUs may differ from that illustrated in FIG. 2, and may include multiple lanes, each of which can transport data between the memory module(s) and the CPU(s). Moreover, the connections between the DIMMs and the CPUs may be routed through various layers in a three dimensional pathway though the PCB 20 and coupled to the CPU through a plurality of connections including, but not limited to, pin connections or ball grid array connections.

As noted above, in certain embodiments the link between the memory modules and the CPUs may be enabled over HSIO links that are capable of multiple gigabit per second per min transfer dates. At the present time HSIO links are capable of at least 5 gigabits per second per pin transfer rate. In certain embodiments a per pin transfer rate of at least 10 gigabits per second is used. Certain embodiments may utilize a per pin transfer rate of about 10 to about 50 gigabits per second. The HSIO links may be communicatively coupled to a CPU through a HSIO interface 29a, 29b that in certain embodiments may be positioned in each of the CPUs 22a, 22b. The HSIO interface 29a, 29b may be part of or separate from the memory controller 26a, 26b. Examples of HSIO interface technologies include, but are not limited to, PCI-Express interface, a fully buffered DIMM interface, a scalable memory interface (SMI), and a point-to-point interface, such as the QuickPath technology by Intel® and the UltraPath technology by Intel®. In certain embodiments the HSIO link may be a high speed serial interface that includes multiple lanes, each of which can transport data between the memory module and the CPU. A HSIO link may use serial communication where the clock at transmitters and receivers is not synchronous. For example, the clock can be derived from a data stream assuming adequate encoding. HSIO may use differential signaling where a signal+ and a signal− with opposite polarity are sent. This helps to remove common mode noise when only the difference in signal (differential) is sensed at the receiver. HSIO links may use a multi-stage amplifier, and multiple equalization at either or both the transmitter and receiver.

In certain embodiments, the same type of input/output link may be used to couple all memory modules to the CPUs. Likewise, in certain embodiments, the same type of memory module may be positioned in the memory module slots. Embodiments may also include different types of input/output links and/or different types of memory modules in the memory module slots. Such mixing of input/output links and/or memory modules may lead to certain design complexities that are not present when the same type of input/output link and memory module is used for all the memory modules.

Embodiments may utilize a variety of memory types, including, but not limited to a variety of DIMMs (of varying pin sizes and using a variety of technologies, including, but not limited to, volatile memory such as DRAM (dynamic random access memory) technology such as JEDEC DDR4, and non-volatile memory such as byte addressable three dimensional crosspoint memory.

Volatile memory requires power to maintain the state of data stored by the medium. Examples of volatile memory may include, but are not limited to, various types of random access memory (RAM), such as dynamic random access memory (DRAM), and static random access memory (SRAM). A type of DRAM that may be used in memory modules such as DIMMs is synchronous dynamic random access memory (SDRAM). In certain embodiments, DRAM of at least some of the memory modules may comply with a standard promulgated by JEDEC, such as JESD79F for Double Data Rate (DDR) SDRAM, JESD79-2F for DDR2 SDRAM, JESD79-3F for DDR3 SDRAM, or JESD79-4A for DDR4 SDRAM (these standards are available at www.jedec.org).

Non-volatile memory does not require power to maintain the state of data stored by the medium. Examples of non-volatile memory may include, but are not limited to, one or more of: solid state memory (such as planar or 3D NAND flash memory or NOR flash memory), three dimensional crosspoint memory, magnetoresistive random access memory (MRAM), storage devices that use chalcogenide phase change material (e.g., chalcogenide glass), byte addressable nonvolatile memory devices, ferroelectric memory, silicon-oxide-nitride-oxide-silicon (SONOS) memory, polymer memory (e.g., ferroelectric polymer memory), ferroelectric transistor random access memory (Fe-TRAM) ovonic memory, nanowire memory, electrically erasable programmable read-only memory (EEPROM), other various types of non-volatile random access memories (RAMs), and magnetic storage memory. Certain of the memory types listed above may overlap with other memory types listed.

In certain embodiments, three dimensional crosspoint memory may comprise a transistor-less stackable cross point architecture in which memory cells sit at the intersection of words lines and bit lines and are individually addressable. The architecture may form a three dimensional structure with the memory cells stacked in multiple layers. Bit storage may be based on a change in bulk resistance.

In certain embodiments, one or more memory modules with non-volatile memory may comply with one or more standards promulgated by the Joint Electron Device Engineering Council (JEDEC), such as JESD218, JESD219, JESD220-1, JESD223B, JESD223-1, or other suitable standard (the JEDEC standards cited herein are available at www.jedec.org).

Certain embodiments may utilize 16 DIMMs per CPU socket. Certain embodiments may include DIMMs all of the same memory type (for example, all volatile memory including, but not limited to, DDR4, or all non-volatile memory including, but not limited to, three dimensional crosspoint memory), or may include different kinds. In certain embodiments, the DIMMs located farther away from the CPUs may use a HSIO as discussed above due to the distance between the DIMMS and the CPUs. For example, in one embodiment, the DIMMs in FIG. 2 may be configured with DIMMs $24a_1$-$24a_4$, $24a_{13}$-$24a_{16}$, $24b_1$-$24b_4$, and $24b_{13}$-$24b_{16}$ being DDR4 DIMMs, and DIMMs $24a_5$-$24a_{12}$, and $24b_5$-$24b_{12}$ being three dimensional crosspoint memory. In another embodiment, all the DIMMs may be three dimensional crosspoint memory. In another embodiment, all the DIMMs may be DRAM such as DDR4. Other combinations of DIMM types are also possible.

Unlike conventional DRAM and DDR4 memory technology, DIMMs formed from non-volatile memory technology (for example, three dimensional cross point memory) may be configured to act as both storage and memory. As a result, conventional hard drive technologies and the like (e.g., solid state drive (SSD)) can be removed from the system, opening up space to provide additional DIMM's that provide storage like a hard drive and also provide additional main memory.

As illustrated in FIG. 1, certain embodiments may include the memory module slots (and memory modules such as DIMMs) positioned to extend lengthwise in a parallel manner to one another in the first row and third row of elements, with memory module slots $14a_1$-$14a_{16}$ extending lengthwise in a parallel manner to each other and also in a parallel manner to memory module slots $14b_1$-$14b_{16}$.

The memory module slots may extend lengthwise in a substantially parallel manner with the sides 6, 8 of the PCB. Furthermore, in certain embodiments, groups of memory module slots may be aligned with each other. For example, as illustrated in FIG. 1, memory module slots $14a_1$-$14_{16}$ are aligned in a lengthwise direction with memory module slots $14b_1$-$14b_{16}$. In addition, the CPU sockets 12a and 12b (and CPU's) may be aligned side by side in certain embodiments. Such a configuration with elements aligned permits an efficient flow of air (or other gas) to cool the elements during operation. For example, as illustrated in FIG. 1, air flow 15 may be directed to flow along the lengthwise direction to the end 4 of the PCB 10 and along the third row of elements, then to the second row of elements, and then to the first row of elements. When components such as DIMMs and CPU's are positioned in the memory module slots, the direction of airflow 15 permits the air to flow across the surfaces of the DIMMs and the surface of the CPUs in an efficient manner. In certain embodiments, for example, CPUs in CPU sockets 12a, 12b may have a height that is less than that of DIMMs in memory module slots $14c_1$-$14c_{16}$, so the air may flow between DIMMs in memory module slots $14c_1$-$14c_{16}$ in the third area, then over the CPUs 12a, 12b in the second area, and then between DIMMs $14a_1$-$14a_{16}$ in the first area. The CPU's 12a, 12b being side by side means that the air flowing through the system only travels over one CPU. A CPU may get hotter than other elements and if the air flow travels over a first CPU and then a second CPU, then the second CPU may not obtain the same cooling benefits due to the air being heated up by the first CPU. The side by side configuration as in FIG. 1 enables both CPUs 12a, 12b to be cooled in a similar manner.

Figures 3, 4:
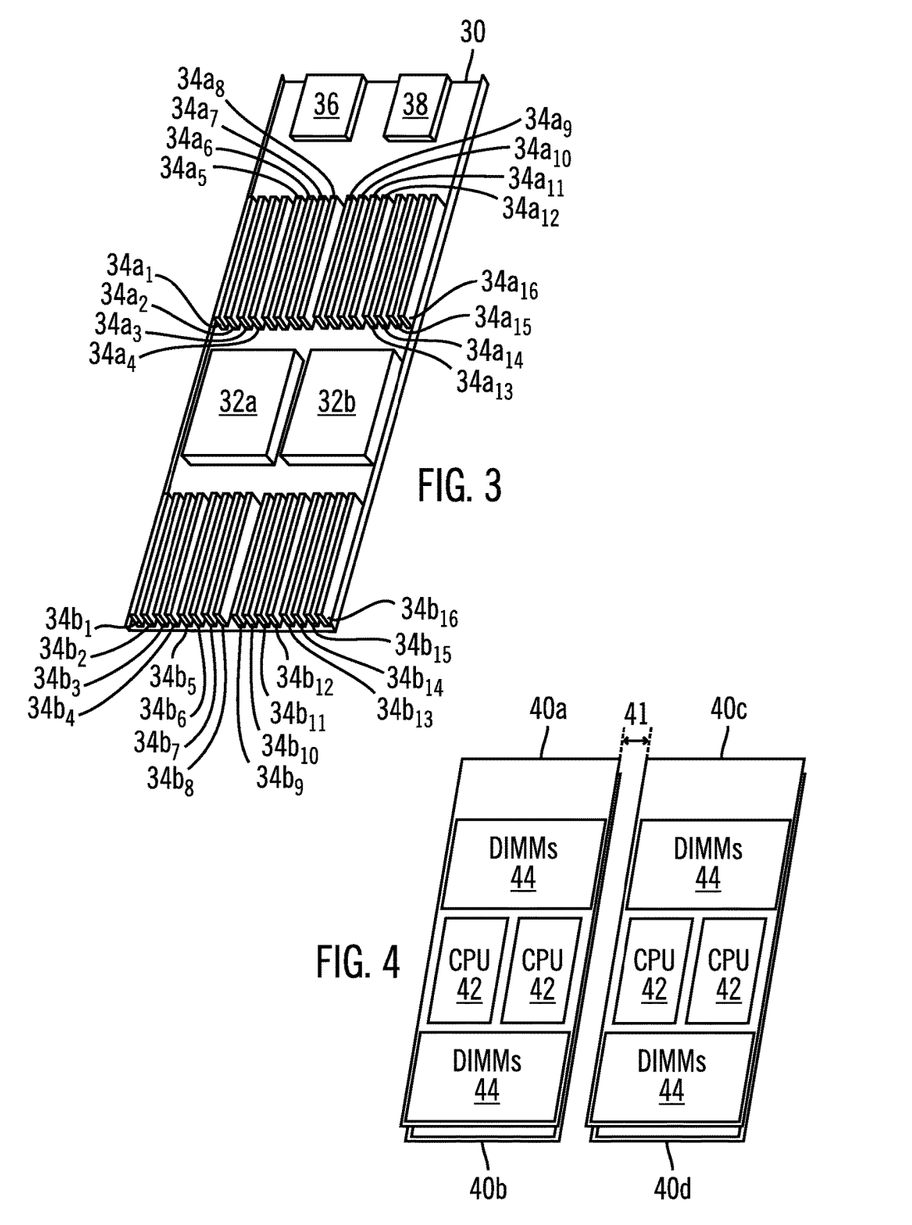
FIG. 3 illustrates a motherboard with elements including CPUs and DIMMs positioned thereon, in accordance with certain embodiments.
FIG. 4 illustrates a system configuration including two sets of stacked motherboards, in accordance with certain embodiments.

FIG. 3 illustrates an embodiment including a motherboard 30, similar to PCB 10, further including CPU and DIMM elements arranged in three rows of elements. The first row includes DIMMs $34a_1$-$34a_{16}$ with no CPU positioned in the row. The second row includes CPUs 32a, 32b positioned side by side across the width of the motherboard 30. The third row includes DIMMs $34c_1$-$34c_{16}$ with no CPU positioned in the row. Embodiments may include a different number of DIMMs or CPUs in each of the rows than illustrated in FIG. 3. For example, the third row could be configured to include a CPU positioned in a central portion of the motherboard, with DIMMs positioned to the sides of the CPU in the third row. The motherboard 30 may also include other features such as external input/output connections 36, 38 positioned near an end of the motherboard 30. Such input/output connections may include any connections, including, but not limited to, Ethernet connections, USB connections, and video connections. Other types of features, including, but not limited to, board management hardware and routing, may also be present on the motherboard 30.

In addition, the embodiment of FIG. 3 illustrates an embodiment including DIMMs that are aligned in a lengthwise direction in a similar manner as the memory module slots in FIG. 1. The DIMMs $34a_1$-$34a_{16}$ and $34b_1$-$34b_{16}$ are aligned along a lengthwise direction with one another. In addition, in the embodiment of FIG. 3, all the DIMMs may be parallel to one another.

FIG. 4 illustrates an embodiment of four motherboards 40a, 40b, 40c, and 40d configured with two groups of stacks of two motherboards, which may be utilized, for example, in a computing system. The motherboards 40a-40d may include a similar layout of elements to those described in connection with FIG. 3 above. In certain embodiments, the motherboards 40a-40d may be half-width motherboards, so that they can fit two across and two high in a conventional chassis such as a 2U (two unit) server rack (chassis). The two groups of stacked motherboards 40a, 40b and 40c, 40d may be positioned side by side as in FIG. 4 and may be separated by a gap 41 into which a component such as a power supply may be positioned. Other configurations are also possible. In certain embodiments, the motherboard may have a length of about 26 to about 30 inches, more particularly about 27.5 inches to about 29 inches. Certain embodiments may have a width of about 6 inches to about 9 inches, more particularly, about 6.5 inches to about 7.5 inches.

Figure 5:
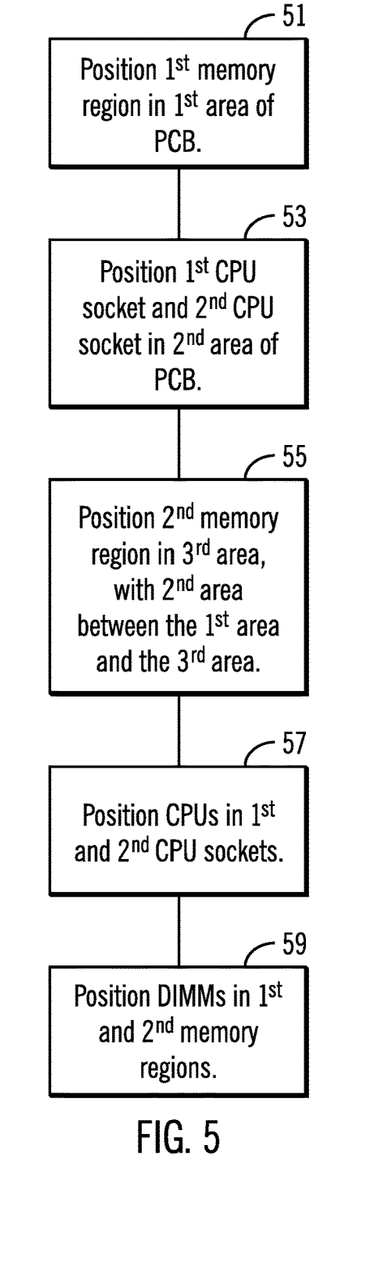
FIG. 5 illustrates a flowchart of operations in accordance with certain embodiments.

FIG. 5 illustrates a flowchart of operations in accordance with certain embodiments including the formation of a PCB for use in computing systems. Box 51 is positioning a first memory region in a first area of the PCB. Box 53 is positioning first and second CPU sockets in a second area of the PCB. The first and second sockets may be positioned side by side across the width of the PCB, such as illustrated in FIG. 1. Box 55 is positioning a second memory region in a third area, with the second area positioned between the first area and the third area. All of the memory regions may be configured to include memory module slots configured to receive memory modules such as DIMMs. In certain embodiments, the first area and the third area may include memory module slots and no CPU socket, as illustrated, for example, in FIG. 1. Box 57 is positioning CPUs in the first and second CPU sockets. Box 59 is positioning DIMM modules in the first and second memory regions. Various embodiments may omit certain operations or add additional and/or modified operations.

Figure 6:
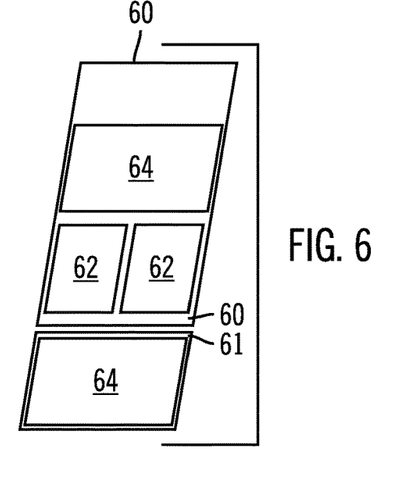
FIG. 6 illustrates a system configuration in accordance with certain embodiments.

For example, in certain embodiments, all three areas are on the PCB. In other embodiments, it is possible that the third area is positioned adjacent to the second area of the PCB on another PCB or other support structure. For example, as illustrated in FIG. 6, a PCB 60 includes two rows of elements thereon, with the first row including a region 64 including DIMMs positioned in memory module slots. The second row includes two regions 62 that each include a CPU in a socket. A structure 61, which may be another PCB, is positioned adjacent to the PCB 60 and includes a region 64 including DIMMs in memory module slots. The structure 61 may be linked to the PCB 60 using a variety of suitable connections.

Figure 7:
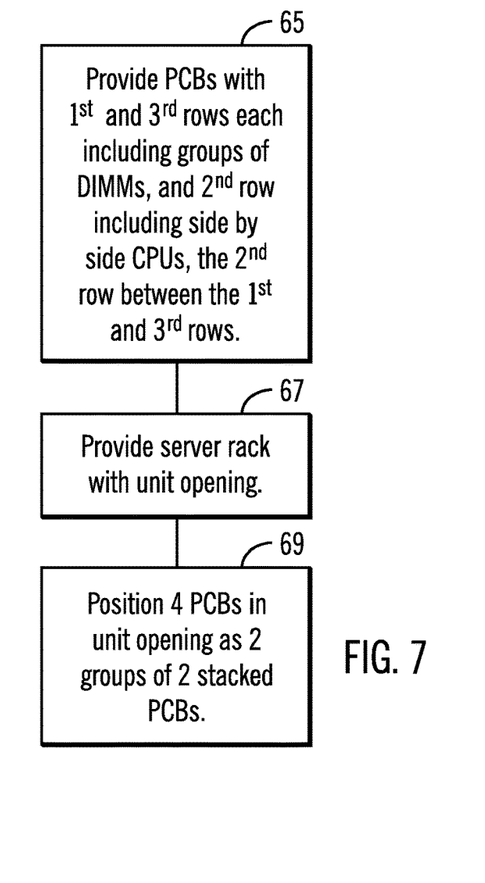
FIG. 7 illustrates a flowchart of operations in accordance with certain embodiments.

FIG. 7 illustrates a flowchart of operations in accordance with certain embodiments for forming computer systems. Box 65 includes providing a plurality of motherboards, each including first and third rows including DIMMs and a second row including side by side CPUs, with the second row positioned between the first row and the third row. The configuration of the motherboards may be similar to those described above. Box 67 includes providing a computing system with an opening for inserting a plurality of PCBs, such as, for example, a server rack with a unit opening. Box 69 includes positioning four PCBs into the opening, as two groups of two stacked motherboards. An example of four PCBs that may be inserted into an opening in a computing system is illustrated in FIG. 4. Various embodiments may omit certain operations or add additional operations to the process.

Figure 8:
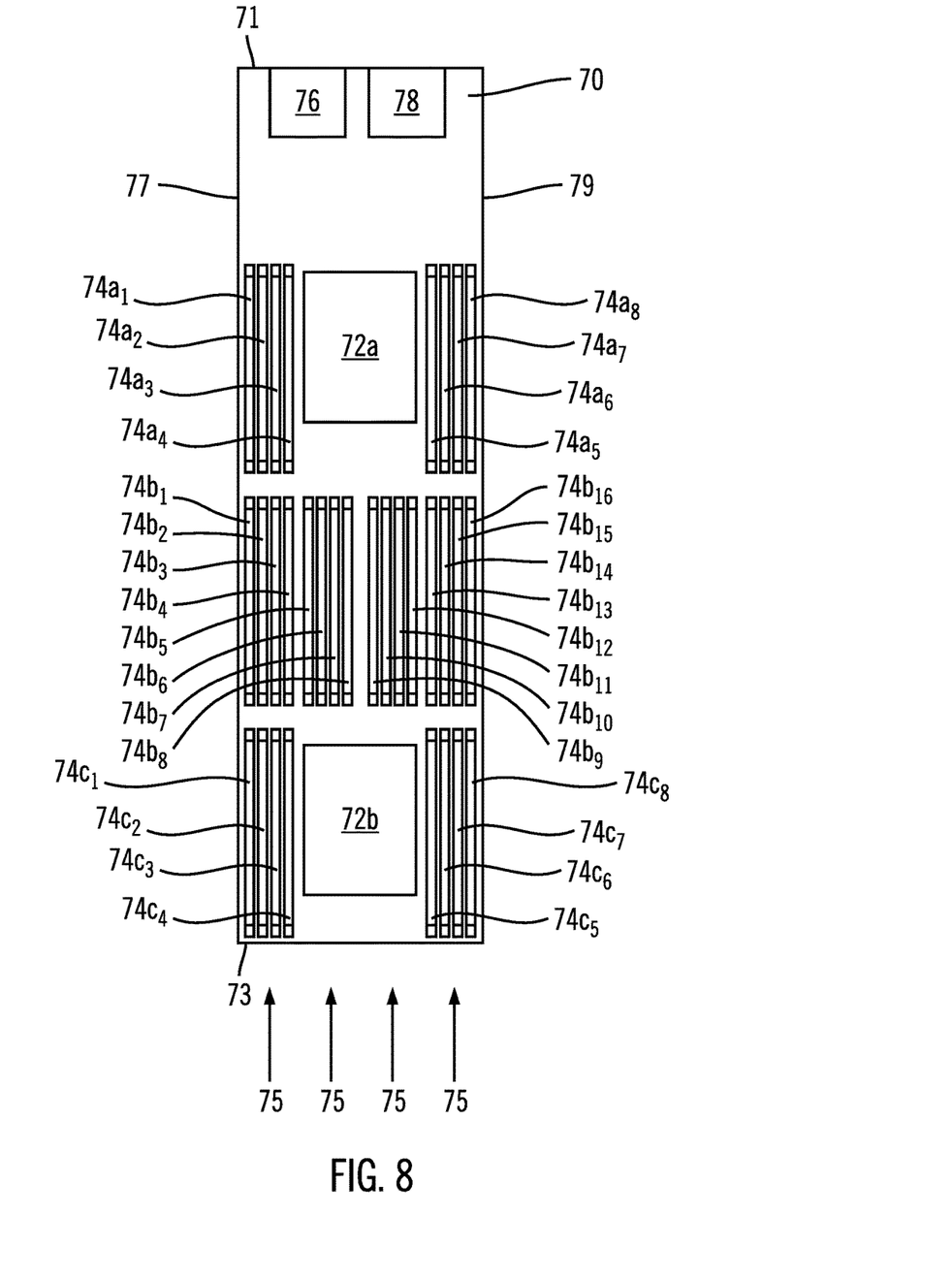
FIG. 8 illustrates a computer platform configuration including a printed circuit board, in accordance with certain embodiments.

Certain embodiments include different configurations than those described above. FIG. 8 illustrates an embodiment of a printed circuit board (PCB) 70 including ends 71, 73 that define a length of the PCB, and sides 77, 79 that define a width of the PCB. The PCB 70 comprises a first row of elements in a first area of the PCB 70 including memory module slots $74a_1$-$74a_4$ positioned to the left of a CPU socket 72a and memory module slots $74a_5$-$74a_8$ positioned to the right of CPU socket 12a. A second row of elements in a second area of the PCB 70 includes memory module slots $14b1$-$14b16$. Similar to the first row, the third row of elements in a third area of the PCB 70 includes memory module slots $74c_1$-$74c_4$ positioned to the left of CPU socket 72b and memory module slots $74b_5$-$74b_8$ positioned to the right of CPU socket 12b. The second row of elements is positioned between the first row of elements and the third row of elements. CPU socket 72a may be electrically coupled to the eight memory module slots $74a_1$-$74a_8$ positioned in the first row of elements and eight of the memory module slots from the second row of elements (for example, memory module slots $74b_1$-$74b_8$). CPU socket 12b may be similarly electrically coupled to the eight memory module slots $74c_1$-$74c_8$ positioned in the third row of elements and eight of the memory module slots from the second row of elements (for example, memory module slots $74b_9$-$74b_{16}$).

The PCB 10 may also include locations 76, 78 near an end of the PCB 10 where other features such as external input/output connections may be made, as discussed above in connection with FIG. 1. Other types of features, including, but not limited to, board management hardware and routing, may also be present on the PCB 70.

Figure 9:
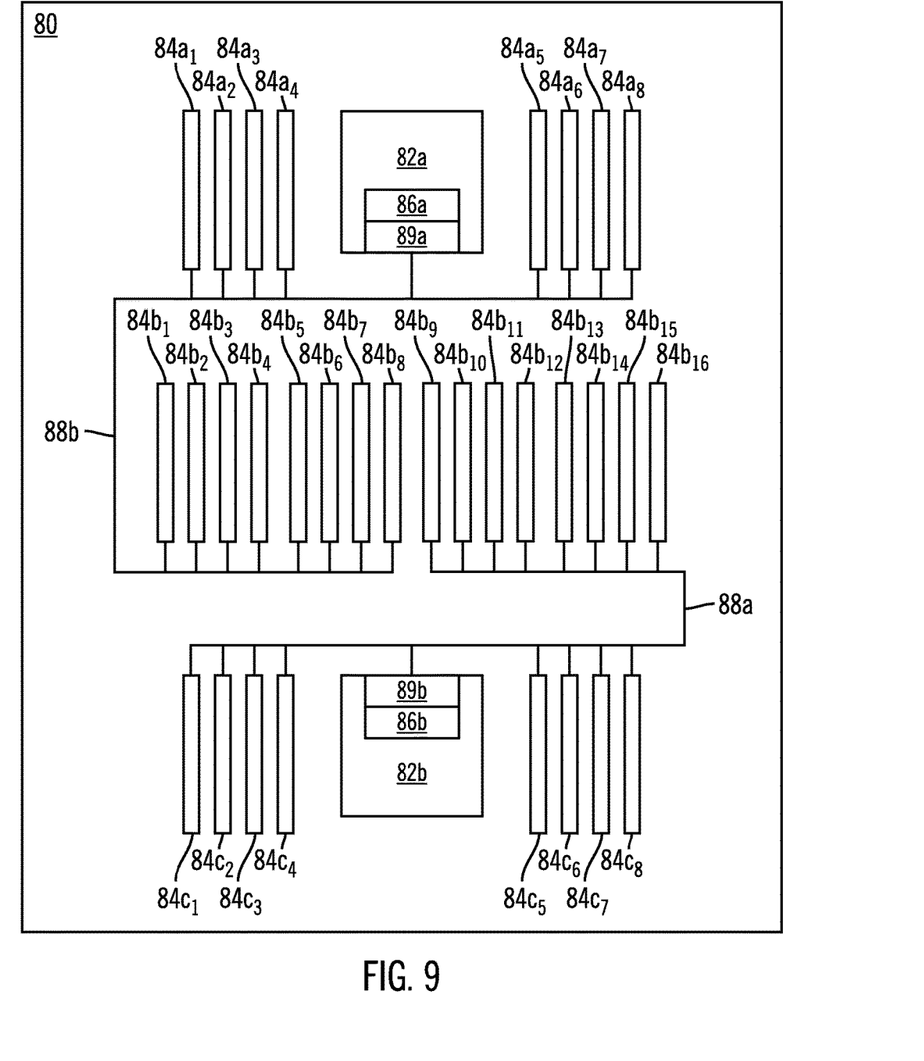
FIG. 9 illustrates CPU and memory module architecture in accordance with certain embodiments.

FIG. 9 illustrates a block diagram illustrating the interaction of first and second CPU's and memory modules (for example, DIMMs) on a PCB 80 in accordance with certain embodiments. As seen in the embodiment illustrated in FIG. 9, the PCB 20 may include three rows of elements, with a first row including a first CPU 82a and a plurality of DIMMs $84a_1$-$84a_8$, a second row of elements including a plurality of DIMMs $84b_1$-$84b_{16}$, and a third row of elements including a second CPU 22b and a plurality of DIMMs $84c_1$-$84c_8$.

DIMMs $84a_1$-$84a_8$ and $84b_1$-$84b_8$ are coupled to a memory controller 86a through a link 88a, and DIMMs $84b_9$-$24b_{16}$ and $84c_1$-$84c_8$ are coupled to a memory controller 26b through a link 28b. The links 88a, 88b may include one or more channels through which data can be delivered. Similar to the configuration of FIG. 2 as described above, in certain embodiments the memory controllers 86a, 86b may be integral to the CPUs 82a, 82b. The links 28a, 28b may in certain embodiments send data from a DIMM to another DIMM prior to the data reaching the memory controllers 86a, 86b. A daisy chain configuration may be used in certain embodiments. Certain embodiments may also utilize the links 88a, 88b in a manner so that data from a DIMM does not pass through any other DIMMs as it is transmitted to the memory controllers 86a, 86b. It should be appreciated that the electrical connection between the DIMMs and the CPUs may differ from that illustrated in FIG. 9, in a manner similar to that described above in connection with FIG. 2. In addition, connections may in certain embodiments be enabled using links including, but not limited to, HSIO links as described above in connection with FIG. 2. As illustrated in FIG. 9, the HSIO links may be communicatively coupled to a CPU through a HSIO interface 89a, 89b that in certain embodiments may be positioned in each of the CPUs 82a, 82$b$. The HSIO interface 89$a$, 89$b$ may be part of or separate from the memory controller 86$a$, 86$b$. The DIMMs 84$a_1$-84$a_8$, 84$b_1$-84$b_{16}$, and 84$c_1$-84$c_8$ may utilize a variety of memory types as described above. In certain embodiments, the DIMMs located farther away from the CPUs may use a HSIO as discussed above due to the distance between the DIMMs and the CPUs.

As illustrated in the embodiment of FIG. 8, the memory module slots (and memory modules such as the DIMMs in FIG. 10) may be positioned to extend lengthwise in a parallel manner to one another in all three rows of elements, with memory module slots 74$a_1$-74$a_8$ extending lengthwise in a parallel manner to each other and also in a parallel manner to memory module slots 74$b_1$-74$b_{16}$, and 74$c_1$-74$c_8$. Furthermore, memory module slots 74$a_1$-74$a_4$ are aligned in a lengthwise direction with memory module slots 74$b_1$-74$b_4$ and memory module slots 74$c_1$-74$c_4$. Similarly, memory module slots 74$a_5$-74$a_8$ are aligned in a lengthwise direction with memory module slots 74$b_{13}$-74$b_{16}$ and memory module slots 74$c_5$-74$c_8$. In addition, the CPU sockets 72$a$ and 72$b$ (and CPU's) may be aligned in a lengthwise direction in certain embodiments. Such a configuration with elements aligned permits an efficient flow of air (or other gas) to cool the elements during operations. For example, as illustrated in FIG. 8, air flow 75 may be directed to flow along the lengthwise direction of the third row of elements and then along the lengthwise direction of elements in the second row of elements and the first row of elements.

Figure 10:
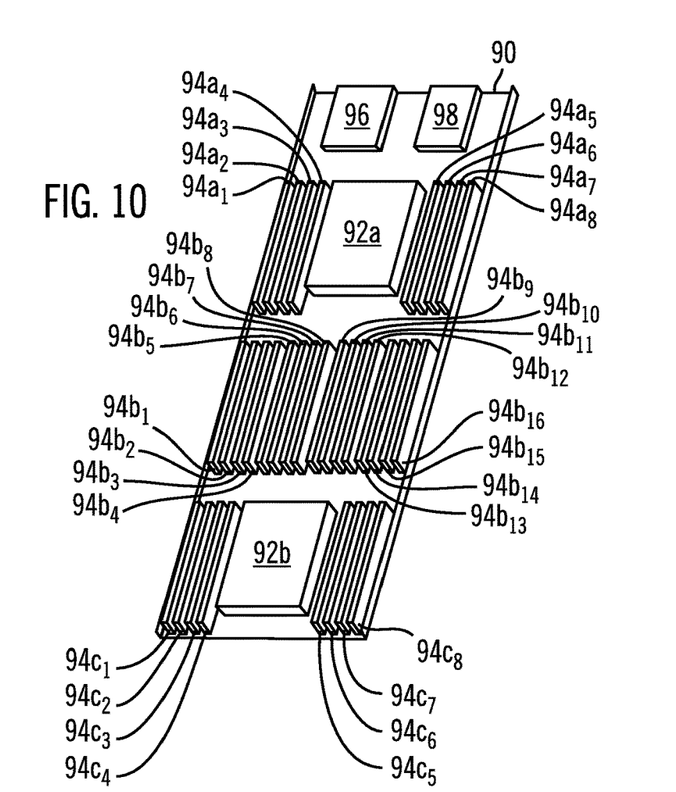
FIG. 10 illustrates a motherboard with elements including CPUs and DIMMs positioned thereon, in accordance with certain embodiments.

FIG. 10 illustrates an embodiment including a motherboard 90 including CPU and DIMM elements arranged in three rows. The first row includes CPU 92$a$ positioned in a central portion of the motherboard 30, between DIMMs 94$a_1$-94$a_4$ and DIMMs 94$a_5$-94$a_8$. The second row includes DIMMs 94$b_1$-94$b_{16}$ with no CPU positioned in the row. The third row includes CPU 92$b$ positioned in a central portion of the motherboard 90, between DIMMs 94$c_1$-91$c_4$ and DIMMs 94$c_5$-94$c_8$. Embodiments may include a different number of DIMMs or CPUs in each of the rows than illustrated in FIG. 10. Similar to the description above, the motherboard 90 may also include other features, including, but not limited to, such as external input/output connections 96, 98 positioned near an end of the motherboard 30.

In addition, FIG. 10 illustrates an embodiment including DIMMs and CPUs that are aligned in a lengthwise direction in a similar manner as the memory module slots and CPU sockets in FIG. 8, with the CPU's 92$a$ and 92$b$ aligned along the lengthwise direction of the motherboard 90. The DIMMs 94$a_1$-94$a_4$, 94$b_1$-94$b_4$, and 94$c_1$-94$c_4$ are aligned along a lengthwise direction with one another, as are DIMMs 94$a_5$-94$a_8$, 94$b_{13}$-94$b_{16}$, and 94$c_5$-94$c_8$. In addition, in the embodiment of FIG. 10, all the DIMMs are parallel to one another.

Certain embodiments have differing temperature performance due to the layout of elements on the PCB. An embodiment such as in FIG. 3, with the CPUs 32$a$, 32$b$ in the same row extending across the width of the PCB 30, has been found to have better heating and cooling characteristics than embodiments having an arrangement such as in FIG. 10, with the CPUs 92$a$, 92$b$ being in different rows that are separated by a row of DIMMs 94$b_1$-94$b_{16}$. This is believed to be due to extra shadow heating of the CPU and the DIMMs from the first CPU along the direction of airflow. The configuration of FIG. 3, with CPUs 32$a$, 32$b$ both in the second, middle row and positioned side by side, provides better air flow (airflow direction 15 in FIG. 1) at least in part because the air flows over the CPUs 32$a$, 32$b$ at the same time, whereas in a configuration such as in FIGS. 8, the air will flow along direction 75 and over the CPU in socket 72$b$ and become preheated, and then that heated air will flow over the central DIMM slots 74$b_5$-74$b_{12}$ in the second row and then onto the CPU in socket 72$a$. As a result, embodiments utilizing a structure such as in FIGS. 1 and 3 may provide improved thermal and performance management due to the configuration.

Figure 11:
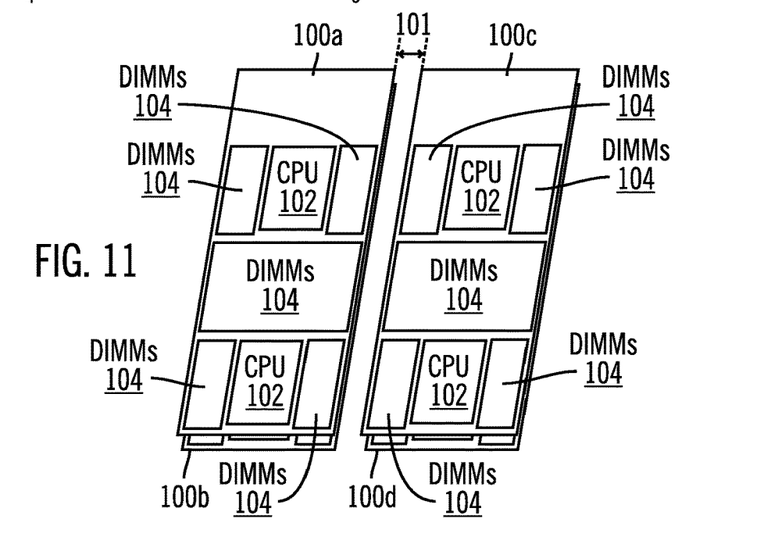
FIG. 11 illustrates a system configuration including two sets of stacked motherboards, in accordance with certain embodiments.

FIG. 11 illustrates an embodiment of four motherboards 100$a$, 100$b$, 100$c$, and 100$d$ configured with two groups of stacks of two motherboards, which may be utilized, for example, in a computing system. The motherboards 100$a$-100$d$ may include a similar layout of elements to those described in connection with FIG. 10 above. The motherboards 100$a$-100$d$ may in certain embodiments be positioned in the same manner as the motherboards 40$a$-40$d$ in FIG. 4, and may have the same dimensions.

Figure 12:
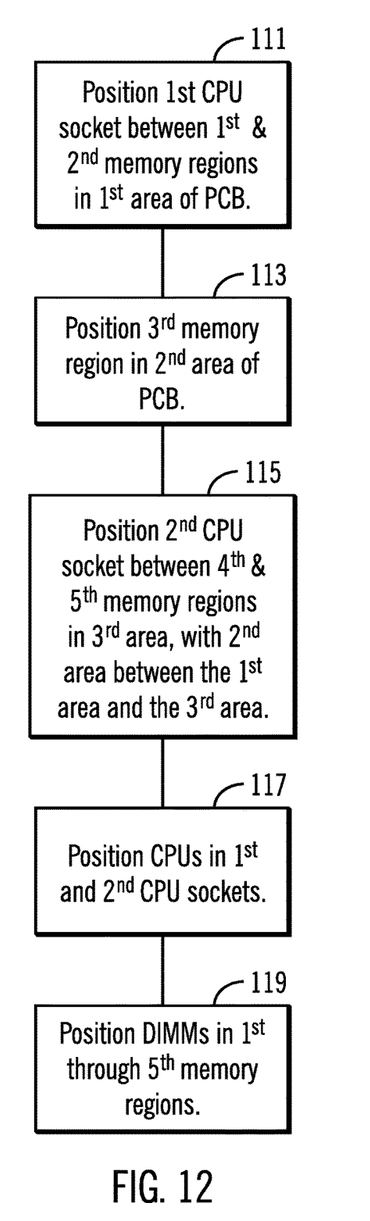
FIG. 12 illustrates a flowchart of operations in accordance with certain embodiments.

FIG. 12 illustrates a flowchart of operations in accordance with certain embodiments. Box 111 is positioning a first CPU socket between a first memory region and a second memory region in a first area of a PCB. Box 113 is positioning a third memory region in a second area of the PCB. Box 115 is positioning a second CPU socket between a fourth memory region and a fifth memory region in a third area of the PCB, with the second area positioned between the first area and the third area. All of the memory regions may be configured to include memory module slots configured to receive memory modules such as DIMMs. In certain embodiments, the second area may include memory module slots and no CPU socket, as illustrated, for example, in FIG. 8. Such a configuration permits the third area to include more memory module slots than the first area or the second area. Box 117 is positioning a CPU in each of the first and second CPU sockets. Box 119 is positioning DIMM modules in the first, second, third, fourth, and fifth memory regions. Various embodiments may omit certain operations or add additional and/or modified operations.

Figure 13:
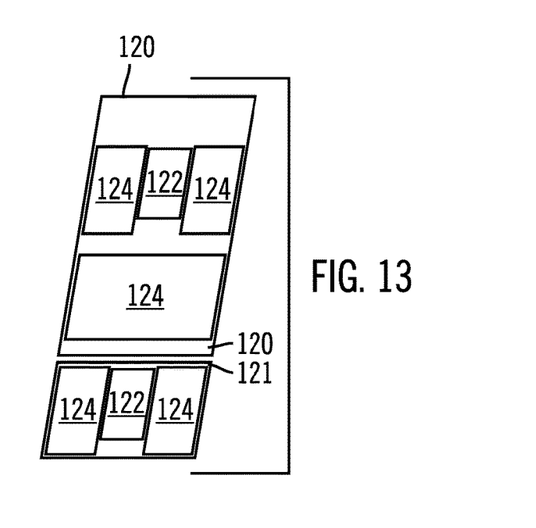
FIG. 13 illustrates a system configuration in accordance with certain embodiments.
Figure 14:
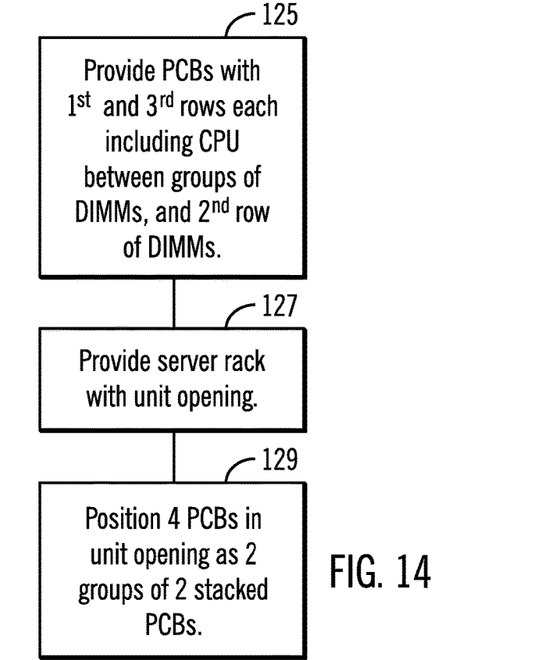
FIG. 14 illustrates a flowchart of operations in accordance with certain embodiments.

For example, in certain embodiments, For example, as illustrated in FIG. 13, a PCB 120 includes two rows of elements thereon, including a first row including a region 122 including a CPU in a socket, positioned between regions 124 including DIMMs in memory module slots, and a second row including a region 124 including DIMMs in memory module slots. A structure 121, which may be another PCB, is positioned adjacent to the PCB 120 and includes a region 122 including a CPU in a socket, positioned between regions 124 including DIMMs in memory module slots. The structure 121 may be linked to the PCB 120 using a variety of suitable connections.

FIG. 7 illustrates a flowchart of operations in accordance with certain embodiments for forming computer systems. Box 125 includes providing a plurality of motherboards, each including first and third rows including a CPU positioned between two groups of DIMMs, and a second row including DIMMs. The configuration of the motherboards may be similar to those described above in connection with FIG. 10. Box 127 includes providing a computing system with an opening for inserting a plurality of PCBs, such as, for example, a server rack with a unit opening. Box 129 includes positioning four PCBs into the opening, as two groups of two stacked motherboards. An example of four PCBs that may be inserted into an opening in a computing system is illustrated in FIG. 11. Various embodiments may omit certain operations or add additional operations to the process.

EXAMPLES

The following examples relate to further embodiments.

Example 1 is an apparatus for receiving memory modules, comprising: a printed circuit board (PCB) defining a length and a width, the length being greater than the width; a first row of elements on the printed circuit board, including a first memory region configured to receive at least one memory module; a second row of elements on the PCB including a first central processing unit (CPU) socket configured to receive a first CPU, and a second CPU socket configured to receive a second CPU, the first CPU socket and the second CPU socket positioned side by side along the width of the PCB; and a third row of elements on the PCB, including a second memory region configured to receive a at least one memory module; wherein the second row of elements is positioned between the first row of elements and the third rows of elements.

In Example 2, the subject matter of any one of Examples 1 and 3-7 can optionally include wherein each of the memory regions configured to receive at least one memory module includes a plurality of memory module slots.

In Example 3, the subject matter of any one of Examples 1-2 and 4-7 can optionally include wherein the first memory region and the second memory region are each configured to accept 16 dual in-line memory modules (DIMMs).

In Example 4, the subject matter of any one of Examples 1-3 and 5-7 can optionally include wherein the printed circuit board includes first and second ends, and first and second sides, wherein the length is a distance from the first end to the second end, wherein the width is a distance from the first side to the second side, and wherein the memory module slots in each of the first and second memory regions extend a direction parallel to the first and second sides of the printed circuit board.

In Example 5, the subject matter of any one of Examples 1-4 and 6-7 can optionally include wherein the printed circuit board comprises a half width motherboard.

In Example 6, the subject matter of any one of Examples 1-5 and 7 can optionally include wherein the printed circuit board includes a high speed input/output (HSIO) link between the first memory region and at least one of the first CPU socket and the second CPU socket, the HSIO link including a transfer rate of at least 5 gigabits per second per pin.

In Example 7, the subject matter of any one of Examples 1-6 can optionally include a plurality of dual in-line memory modules positioned in each of the memory regions.

Example 8 is a method for configuring a printed circuit board to receive memory modules, comprising: providing a printed circuit board having a length and a width, the length being greater than the width; positioning a first memory region in a first area of a printed circuit board, the first memory regions configured to accept at least one memory module; positioning a first CPU socket and a second CPU socket in a second area of a printed circuit board, the first CPU socket and the second CPU socket being positioned side by side along the width of the printed circuit board; and positioning a second memory region in a third area of the printed circuit board, the second memory region configured to accept at least one memory module; wherein the second area of the printed circuit board is positioned between the first area of the printed circuit board and the third area of the printed circuit board.

In Example 9, the subject matter of any one of Examples 8 and 10-13 can optionally include comprising configuring the first and second memory regions to include memory module slots.

In Example 10, the subject matter of any one of Examples 8-9 and 11-13 can optionally include configuring the memory regions so that the first memory region and the second memory region are each configured to accept 16 DIMMs.

In Example 11, the subject matter of any one of Examples 8-10 and 12-13 can optionally include configuring the first memory region and the second memory region to each include a plurality of memory module slots that each extend along a direction parallel to a side of the printed circuit board that defines the length of the printed circuit board.

In Example 12, the subject matter of any one of Examples 8-11 and 13 can optionally include positioning a plurality of DIMMs in each of the first and second memory regions, and positioning a CPU in each of the first and second CPU sockets.

In Example 13, the subject matter of any one of Examples 8-12 can optionally include configuring the printed circuit board to include a high speed input/output (HSIO) link between at the least some of the DIMMS in the first memory region and the CPU in the first memory region, the HSIO link including a transfer rate of at least 5 gigabits per second per pin.

Example 14 is an apparatus for positioning dual in-line memory modules, comprising: a printed circuit board (PCB) defining a length and a width, the length being greater than the width; a first row of elements on the printed circuit board, including a first group of dual in-line memory modules (DIMMs); a second row of elements on the printed circuit board, including a first central processing unit (CPU) and a second CPU positioned side by side along the width of the printed circuit board; and a third row of elements, including a second group of DIMMs, wherein the second row of elements is positioned between the first row of elements and the third row of elements.

In Example 15, the subject matter of any one of Examples 14 and 16-22 can optionally include wherein the first and second groups of DIMMs each include 16 DIMMs.

In Example 16, the subject matter of any one of Examples 14-15 and 17-22 can optionally include wherein the DIMMs in the first and second groups of DIMMs extend along a direction parallel to a side of the PCB that defines the length of the printed circuit board.

In Example 17, the subject matter of any one of Examples 14-16 and 18-22 can optionally include wherein the printed circuit board comprises a half width motherboard.

In Example 18, the subject matter of any one of Examples 14-17 and 19-22 can optionally include a first high speed input/output (HSIO) link between the first CPU and a first subgroup of dual in-line memory modules (DIMMs) of the first group of DIMMS, the HSIO link including a transfer rate of at least 5 gigabits per second per pin.

In Example 19, the subject matter of any one of Examples 14-18 and 20-22 can optionally include wherein the first, second, and third rows of elements are positioned on the printed circuit board.

In Example 20, the subject matter of any one of Examples 1-19 and 21-27 can optionally include wherein the printed circuit board has a length in a range of 26 to 30 inches and a width in a range of 6 inches to 9 inches.

In Example 21, the subject matter of any one of Examples 1-20 and 22-27 can optionally include wherein the printed circuit board has a length in a range of 27.5 inches to 29 inches.

In Example 22, the subject matter of any one of Examples 14-21 can optionally include a system including the apparatus of any one of Examples 14-21, wherein the printed circuit board is a first printed circuit board, the system comprising: second, third, and fourth printed circuit boards, each including: a first row of elements on the printed circuit board, including a first group of dual in-line memory modules (DIMMs); a second row of elements on the printed circuit board, including a first central processing unit (CPU) and a second CPU positioned side by side along the width of the printed circuit board; and a third row of elements, including a second group of DIMMs, wherein the second row of elements is positioned between the first row of elements and the third row of elements; a first stack including the first printed circuit board stacked on the second printed circuit board; and a second stack including the third printed circuit board stacked on the fourth printed circuit board; wherein the first stack and the second stack are positioned side by side.

Example 23 is an apparatus comprising: a printed circuit board defining a length and a width, the length being greater than the width; a printed circuit board (PCB) including first, second, and third rows of elements; the first row of elements on the PCB including a first CPU socket configured to receive a first CPU, a first memory region configured to receive at least one memory module, and a second memory region configured to receive at least one memory module, the first CPU socket positioned between the first memory region and the second memory region; the second row of elements including a third memory region configured to receive at least one memory module; the third row of elements including a second CPU socket configured to receive a second CPU, a fourth memory region configured to receive at least one memory module, and a fifth memory region configured to receive at least one memory module, the second CPU socket positioned between the third memory region and the fourth memory region; and wherein the second row of elements is positioned between the first row of elements and the third rows of elements.

In Example 24, the subject matter of any one of Examples 23 and 25 can optionally include wherein the first memory region and the second memory region are each configured to accept 16 DIMMs.

In Example 25, the subject matter of any one of Examples 23-24 can optionally include wherein the printed circuit board includes a high speed input/output (HSIO) link between the third memory region and at least one of the first CPU socket and the second CPU socket, the HSIO link including a transfer rate of at least 5 gigabits per second per pin.

Example 26 is an apparatus including a printed circuit board having a length and a width, the length being greater than the width, comprising: means for positioning a first memory region in a first area of a printed circuit board, the first memory regions configured to accept at least one memory module; means for positioning a first CPU socket and a second CPU socket in a second area of a printed circuit board, the first CPU socket and the second CPU socket being positioned side by side along the width of the printed circuit board; and means for positioning a second memory region in a third area of the printed circuit board, the second memory region configured to accept at least one memory module; and wherein the second area of the printed circuit board is positioned between the first area of the printed circuit board and the third area of the printed circuit board.

Example 27 is an apparatus comprising means to perform a method as described in any preceding Example.

Various features of embodiments described above may be implemented with respect to other embodiments, including both apparatus and method embodiments. Specifics in the examples may be used anywhere in one or more embodiments.

In the foregoing description above, various features are grouped together for the purpose of streamlining the disclosure. This method of disclosure is not to be interpreted as reflecting an intention that the claimed embodiments of the invention require more features than are expressly recited in each claim. Rather, as the following claims reflect, inventive subject matter may lie in less than all features of a single disclosed embodiment. Thus the following claims are hereby incorporated into the Detailed Description, with each claim standing on its own as a separate embodiment.

While certain exemplary embodiments have been described above and shown in the accompanying drawings, it is to be understood that such embodiments are merely illustrative and not restrictive, and that embodiments are not restricted to the specific constructions and arrangements shown and described since modifications may occur to those having ordinary skill in the art. Terms such as "first", "second", and the like may be used herein and do not necessarily denote any particular order, quantity, or importance, but are used to distinguish one element from another. Terms such as "upper", "lower", "top", "bottom", and the like may be used for descriptive purposes only and are not to be construed as limiting. Embodiments may be manufactured, used, and contained in a variety of positions and orientations.

What is claimed:

1. An apparatus comprising:
   a printed circuit board (PCB) defining a length and a width, the length being greater than the width;
   a first row of elements on the printed circuit board, including a first memory region configured to receive at least one memory module;
   a second row of elements on the PCB including a first central processing unit (CPU) socket configured to receive a first CPU, and a second CPU socket configured to receive a second CPU, the first CPU socket and the second CPU socket positioned side by side along the width of the PCB; and
   a third row of elements on the PCB, including a second memory region configured to receive a at least one memory module;
   wherein the second row of elements is positioned between the first row of elements and the third rows of elements.

2. The apparatus of claim 1, wherein each of the memory regions configured to receive at least one memory module includes a plurality of memory module slots.

3. The apparatus of claim 1, wherein the first memory region and the second memory region are each configured to accept 16 DIMMs.

4. The apparatus of claim 2, wherein the printed circuit board includes first and second ends, and first and second sides, wherein the length is a distance from the first end to the second end, wherein the width is a distance from the first side to the second side, and wherein the memory module slots in each of the first and second memory regions extend a direction parallel to the first and second sides of the printed circuit board.

5. The apparatus of claim 1, wherein the printed circuit board comprises a half width motherboard.

6. The apparatus of claim 1, wherein the printed circuit board includes a high speed input/output (HSIO) link between the first memory region and at least one of the first CPU socket and the second CPU socket, the HSIO link including a transfer rate of at least 5 gigabits per second per pin.

7. The apparatus of claim 1, further comprising a plurality of dual in-line memory modules positioned in each of the memory regions.

8. A method comprising:
providing a printed circuit board having a length and a width, the length being greater than the width;
positioning a first memory region in a first area of a printed circuit board, the first memory regions configured to accept at least one memory module;
positioning a first CPU socket and a second CPU socket in a second area of a printed circuit board, the first CPU socket and the second CPU socket being positioned side by side along the width of the printed circuit board; and
positioning a second memory region in a third area of the printed circuit board, the second memory region configured to accept at least one memory module;
wherein the second area of the printed circuit board is positioned between the first area of the printed circuit board and the third area of the printed circuit board.

9. The method of claim 8, further comprising configuring the first and second memory regions to include memory module slots.

10. The method of claim 8, further comprising configuring the memory regions so that the first memory region and the second memory region are each configured to accept 16 DIMMs.

11. The method of claim 8, further comprising configuring the first memory region and the second memory region to each include a plurality of memory module slots that each extend along a direction parallel to a side of the printed circuit board that defines the length of the printed circuit board.

12. The method of claim 8, further comprising positioning a plurality of DIMMs in each of the first and second memory regions, and positioning a CPU in each of the first and second CPU sockets.

13. The method of claim 12, further comprising configuring the printed circuit board to include a high speed input/output (HSIO) link between at least some of the DIMNIS in the first memory region and the CPU in the first memory region, the HSIO link including a transfer rate of at least 5 gigabits per second per pin.

14. An apparatus comprising:
a printed circuit board (PCB) defining a length and a width, the length being greater than the width;
a first row of elements on the printed circuit board, including a first group of dual in-line memory modules (DIMIVIs);
a second row of elements on the printed circuit board, including a first central processing unit (CPU) and a second CPU positioned side by side along the width of the printed circuit board; and
a third row of elements, including a second group of DIMMs, wherein the second row of elements is positioned between the first row of elements and the third row of elements.

15. The apparatus of claim 14, wherein the first and second groups of DIMMs each include 16 DIMMs.

16. The apparatus of claim 14, wherein the DIMMs in the first and second groups of DIMIVIs extend along a direction parallel to a side of the PCB that defines the length of the printed circuit board.

17. The apparatus of claim 14, wherein the printed circuit board comprises a half width motherboard.

18. The apparatus of claim 14, further comprising a first high speed input/output (HSIO) link between the first CPU and a first subgroup of dual in-line memory modules (DIMMs) of the first group of DIMMS, the HSIO link including a transfer rate of at least 5 gigabits per second per pin.

19. The apparatus of claim 15, wherein the first, second, and third rows of elements are positioned on the printed circuit board.

20. The apparatus of claim 19, wherein the printed circuit board has a length in a range of 26 to 30 inches and a width in a range of 6 inches to 9 inches.

21. The apparatus of claim 19, wherein the printed circuit board has a length in a range of 27.5 inches to 29 inches.

22. A system including the apparatus of claim 14, wherein the printed circuit board is a first printed circuit board, the system comprising:
second, third, and fourth printed circuit boards, each including:
a first row of elements on the printed circuit board, including a first group of dual in-line memory modules (DIMMs);
a second row of elements on the printed circuit board, including a first central processing unit (CPU) and a second CPU positioned side by side along the width of the printed circuit board; and
a third row of elements, including a second group of DIMMs, wherein the second row of elements is positioned between the first row of elements and the third row of elements;
a first stack including the first printed circuit board stacked on the second printed circuit board; and
a second stack including the third printed circuit board stacked on the fourth printed circuit board;
wherein the first stack and the second stack are positioned side by side.

23. An apparatus comprising:
a printed circuit board defining a length and a width, the length being greater than the width;
a printed circuit board (PCB) including first, second, and third rows of elements;
the first row of elements on the PCB including a first CPU socket configured to receive a first CPU, a first memory region configured to receive at least one memory module, and a second memory region configured to receive at least one memory module, the first CPU socket positioned between the first memory region and the second memory region;
the second row of elements including a third memory region configured to receive at least one memory module;
the third row of elements including a second CPU socket configured to receive a second CPU, a fourth memory region configured to receive at least one memory module, and a fifth memory region configured to receive at least one memory module, the second CPU socket positioned between the third memory region and the fourth memory region; and
wherein the second row of elements is positioned between the first row of elements and the third rows of elements.

24. The apparatus of claim 23, wherein the first memory region and the second memory region are each configured to accept 16 DIMMs.

25. The apparatus of claim 23, wherein the printed circuit board includes a high speed input/output (HSIO) link between the third memory region and at least one of the first CPU socket and the second CPU socket, the HSIO link including a transfer rate of at least 5gigabits per second per pin.

\* \* \* \* \*